United States Patent [19]

Maeda et al.

[11] Patent Number: 4,875,012
[45] Date of Patent: Oct. 17, 1989

[54] IMAGE RECONSTRUCTION METHOD IN NUCLEAR MAGNETIC RESONANCE IMAGING SYSTEM

[75] Inventors: Akira Maeda, Machida; Koichi Sano, Sagamihara; Tetsuo Yokoyama, Tokyo; Hideaki Koizumi, Katsuta; Hirotaka Mizuno, Yokohama, all of Japan

[73] Assignee: Hitachi, Ltd., Tokyo, Japan

[21] Appl. No.: 153,199

[22] Filed: Feb. 8, 1988

[30] Foreign Application Priority Data

Mar. 20, 1987 [JP] Japan ................................. 62-63766
May 15, 1987 [JP] Japan ............................... 62-116804
Oct. 23, 1987 [JP] Japan ............................... 62-266368

[51] Int. Cl.$^4$ ........................................... G01R 33/20
[52] U.S. Cl. .................................... 324/309; 324/312
[58] Field of Search ............... 324/307, 309, 312, 306; 128/653

[56] References Cited

U.S. PATENT DOCUMENTS

| | | | |
|---|---|---|---|
| 4,651,096 | 3/1987 | Buonocore | 324/309 |
| 4,661,775 | 4/1987 | Kormos et al. | 324/312 |
| 4,720,679 | 1/1988 | Patrick et al. | 324/312 |
| 4,727,325 | 2/1988 | Matsui et al. | 324/312 |
| 4,728,893 | 3/1988 | Feinberg | 324/312 |
| 4,746,860 | 5/1988 | Satoh | 324/309 |
| 4,746,864 | 5/1988 | Satoh | 324/309 |
| 4,767,991 | 8/1988 | Rzedzian | 324/312 |

OTHER PUBLICATIONS

Macovski et al., "A Novel Fast-Scanning System", Proc. of 5th Annual Meeting, Magnetic Resonance in Medicine, 1986, pp. 156–157.
Shenberg et al., "Resolution . . . Time-Varying Gradients", IEEE Trans. on Med. Imaging, vol. MI-4, No. 3, Sep. 1985.
Shenberg et al., "Inhomogeneity . . . Time-Varying Gradients", IEEE Trans. on Med. Imaging, vol. MI-4, No. 3, Sep. 1985.
Ahn et al., "High-Speed Spiral-Scan . . . Imaging-I", IEEE Trans. on Med. Imaging, vol. MI-5, No. 1, Mar. 1986.
Shimizu et al., "Visualization of Moving Fluid . . . MR Imaging", Radiology, vol. 159, 1986.
Ljunggren, S., "A Simple Graphical Representation . . . Methods", J. Magnetic Resonance, vol. 54, 1983.
Macovski, A., "Volumetric . . . Time-Varying Gradients", Magnetic Resonance in Medicine, vol. 2, 1985.

*Primary Examiner*—Tom Noland
*Assistant Examiner*—Kevin D. O'Shea
*Attorney, Agent, or Firm*—Antonelli, Terry & Wands

[57] ABSTRACT

In an nuclear magnetic resonance imaging system for acquiring a tomographic image of an object of interest at a high speed by use of time-varying gradient magnetic fields, a weighting factor is used in reconstructing an image through the calculation of a correlation of data of a detected nuclear magnetic resonance signal with data of a reference signal, thereby controlling the point spread function and/or the signal-to-noise ratio in each point on the reconstruction image. Also, the effect of relaxation, chemical shift and/or static magnetic field inhomegeneity, which would otherwise degrade the image quality, can be corrected. Further, a velocity of the object of interest at each point on the reconstruction image can be measured.

15 Claims, 7 Drawing Sheets

F I G. 8
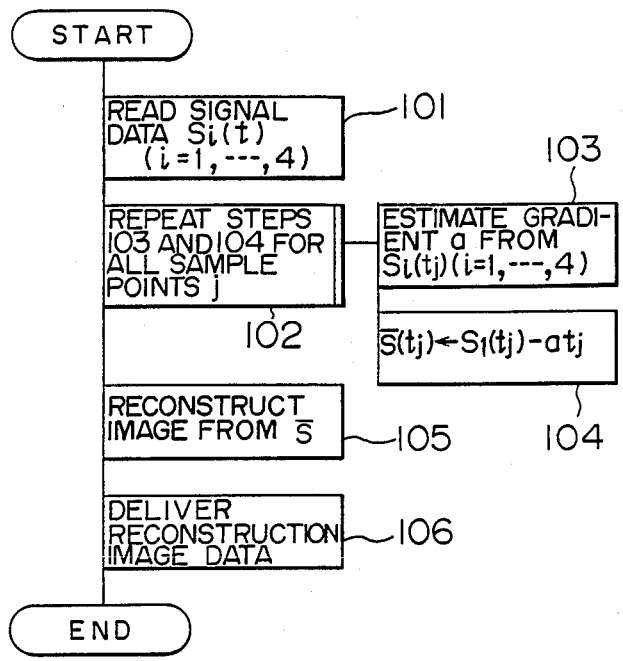
F I G. 9
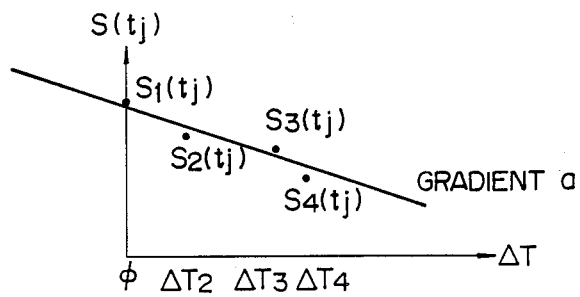

IMAGE RECONSTRUCTION METHOD IN NUCLEAR MAGNETIC RESONANCE IMAGING SYSTEM

BACKGROUND OF THE INVENTION

The present invention relates to an image reconstruction method in an in vivo tomographic imaging system utilizing a nuclear magnetic resonance (NMR) phenomenon, and more particularly to an image reconstruction method in an NMR imaging system which uses time-varying gradient magnetic fields and is useful for the reduction in time necessary for various measurements and the acquisition of a tomographic (or cross-sectional) image with high quality.

Prior art examples of an NMR imaging system for acquiring a tomographic image at a high speed by use of time-varying gradient magnetic fields are disclosed by I. Shenberg et al, "Resolution and Noise Considerations in NMR Systems with Time-Varying Gradients", IEEE Transactions on Medical Imaging, Vol. MI-4, No. 3, pp. 144-152, 1985, I. Shenberg et al, "Inhomogeneity and Multiple Dimension Considerations in Magnetic Resonance Imaging with Time-Varying Gradients", IEEE Transactions on Medical Imaging, Vol. MI-4, Vol. 3, pp. 165-174, 1985, and C. B. Ahn et al, "High-Speed Spiral-Scan Echo Planar NMR Imaging-I", IEEE Transactions on Medical Imaging, Vol. MI-5 No. 1, pp. 2-7, 1986. However, in these prior art examples, the control or correction of the point spread function or signal-to-noise (S/N) ratio of a reconstructed image is not sufficiently taken into consideration though a method of controlling the point spread function is disclosed in connection with only very special cases. Further, it is possible to correct the inhomogeneity effect of a static magnetic field.

Approaches for reducing the effect or artifact of spin-spin relaxation called $T_2$, chemical shift and/or static magnetic field inhomogeneity in NMR imaging systems are described in, for example, A. Macovski et al, "A Novel Fast-Scanning System", Proceedings of 5th Annual Meeting Magnetic Resonance in Medicine, Works in Progress, pp. 156-157, 1986 from which there are known a method in which scans retraced in the opposite direction in a frequency domain are added for the reduction of effect of $T_2$ relaxation and a method in which 180° RF pulses are used for the reduction of effect of $T_2$ relaxation chemical shift, and/or static magnetic field inhomogeneity. However, the method of adding such redundant scans is accompanied with the degradation of the S/N ratio or the increase of data measurement time. On the other hand, the method of using the 180° RF pulses cannot avoid the degradation of an image quality due to the imperfection of 180° RF pulses. Further, in both the methods, though the effect of $T_2$ relaxation, chemical shift and/or inhomogeneity can be corrected to a certain extent, it is not possible to measure separately the effect of relaxation, etc.

In NMR imaging systems, many methods are known in which time required for measurement is reduced by measuring an NMR signal under time-varying gradient magnetic fields. Generally, in these methods, time for measurement of an NMR signal for one spin excitation becomes long (though the total measurement time is reduced since the times of spin excitation can be decreased). Therefore, the effect of relaxation, chemical shift and/or static magnetic field inhomogeneity should be corrected, otherwise, the quality of a reconstruction image is seriously degraded.

Also, approaches for simultaneously visualizing the position and velocity of nucleus spins are disclosed by, for example, K. Shimizu et al, "Visualization of Moving Fluid: Quantitative Analysis of Blood Flow Velocity Using MR Imaging", Radiography, Vol. 159, No. 1, pp. 195-199, 1986, and S. Ljunggren, "A Simple Graphical Representation of Fourier-Based Imaging Methods", Journal of Magnetic Resonance, Vol. 54, pp. 338-343, 1983. Shimizu et al disclose a method in which a new coordinate corresponding to a direction of velocity is introduced and the velocity and the position are simultaneously imaged through a multi-dimensional Fourier transform in combination of the new coordinate and usual position coordinates. However, this method involves a problem that measurement time becomes long since an imaging in the velocity direction requires many times of measurement because of the use of the Fourier transform for imaging. Ljunggren discloses a method in which data of the multi-dimensional Fourier domain is effectively collected by means of time-varying gradient magnetic fields. In principle, this method permits high-speed measurement. But, Ljunggren does not disclose any concrete image reconstruction method.

SUMMARY OF THE INVENTION

A first object of the present invention is to provide an image reconstruction method which makes it possible to flexibly alter the point spread function and/or S/N ratio of a reconstruction image in accordance with the characteristics of an NMR imaging system or the user's demands, permits the acquisition of an image with high quality through the correction of the inhomogeneity effect of a static magnetic field, and is applicable to any variation pattern of gradient magnetic fields.

A second object of the present invention is to provide an image reconstruction method which makes it possible to correct the effect of relaxation, chemical shift and/or inhomogeneity with high accuracy and to produce a relaxation time image, a chemical shift image and/or an inhomogeneity map, by estimating separately the effect of relaxation, chemical shift and/or inhomogeneity on the basis of a plurality of NMR signals associated with different start timings of data measurement.

A third object of the present invention is to provide an image reconstruction method which permits the simultaneous imaging of the information regarding the position and velocity of spins for a short measurement time.

The above-mentioned first object of the present invention is achieved by establishing a predetermined weighting factor in accordance with the requirements for the point spread function and/or S/N ratio of a reconstruction image or the degree of inhomogeneity of the static magnetic field, and performing calculation of the weighted correlation of reference signal data and detected signal data by use of the predetermined weighting factor. The weighting factor may be different for respective points on the reconstruction image, as required.

The second object of the present invention is achieved in such a manner that on the basis of the result of the estimation of the effect of relaxation, chemical shift and/or inhomogeneity based on a set of NMR signals associated with the different data measurement start timings, an NMR signal free of the effect of relaxation, chemical shift and/or inhomogeneity is produced and an image reconstruction is made using such an NMR signal.

The third object of the present invention is achieved by detecting an NMR signal generated from an object of interest while applying time-varying gradient magnetic fields varying in accordance with a predetermined pattern, and calculating a correlation of the detected NMR signal with a reference NMR signal which is defined by any given position in a desired region of the object, a velocity at that position and the variation pattern of the gradient magnetic fields, thereby determining the density of spins which have the given position and the velocity.

BRIEF DESCRIPTION OF THE DRAWINGS

FIG. 8 is a flow chart showing a processing for image reconstruction in the second embodiment of the present invention;

FIG. 9 is a view for explaining the principle of step 103 in the flow chart shown in FIG. 8;

DESCRIPTION OF THE PREFERRED EMBODIMENTS

Figure 1:
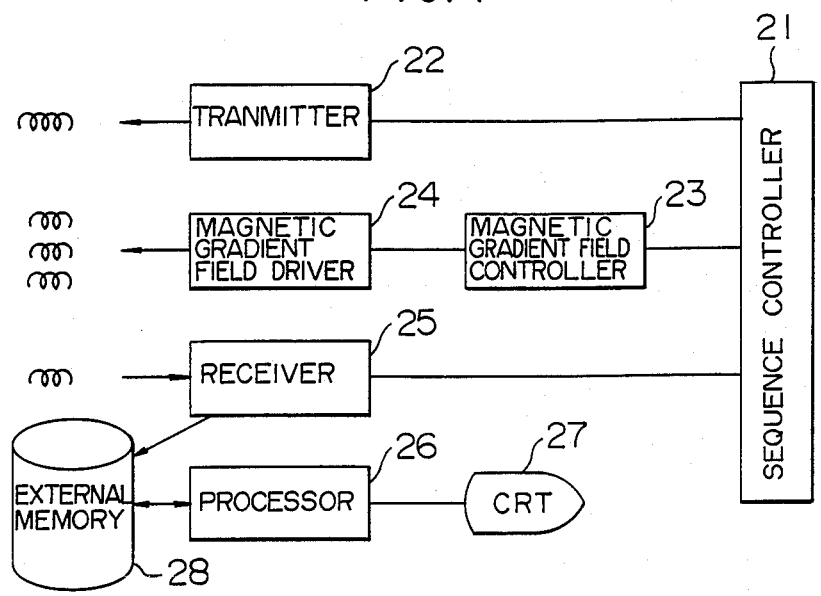
FIG. 1 shows a block diagram of an NMR imaging system which embodies the present invention.

The principle of a first embodiment of the present invention will first be described in conjunction with the case of a two-dimensional tomographic imaging by way of an example. The argument is similarly valid in the three-dimensional case and the four-dimensional case where a chemical shift is taken into consideration.

Now assume that a two-dimensional coordinate system is established for an xy plane and the intensities of gradient magnetic fields in the x- and y-directions are $G_x(t)$ and $G_y(t)$, respectively. Then, a detected signal $S_j$ ($j=1, 2, \ldots, N$) which is digital data after the reception and detection of an NMR signal, N being the number of sample data, is represented by $$S_j = C \int dx\, dy\, \rho(x, y) \exp[-2\pi i \gamma \{k_x(t_j)x + k_y(t_j)y + \Delta H(x, y)t_j\}]. \quad (1)$$

where $(k_x(t), k_y(t))$ is a sample point with $k_x(t)$ and $k_y(t)$ defined by $$k_x(t) = \int_0^t G_x(t') dt'$$

$$k_y(t) = \int_0^t G_y(t') dt',$$

$\gamma$ is the gyromagnetic ratio, $\Delta H$ is the degree of inhomogeneity of a static magnetic field, $\rho(x, y)$ is the density of nucleus spins, C is a proportional constant, i is the unit of an imaginary number equal to $\sqrt{-1}$, and $t_j$ is the j-th sampling instant of time. The effect of $T_1$ and $T_2$ relaxation times and the effect of any movement are omitted from the equation (1) since those effects are insignificant and irrelevant to the first embodiment of the present invention.

On the other hand, a reference signal, that is, a signal to be measured when the gradient magnetic fields are applied to spins at a position where the intensity of an NMR signal is to be determined, can be represented by $$g_j(x', y') = \exp[-2\pi i \gamma \{k_x(t_j)x' + k_y(t_j)y' + \Delta H(x', y')t_j\}]. \quad (2)$$

Accordingly, the value $\rho(x', y')$ of a reconstruction image at $(x', y')$ is given by the following correlation of the equations (1) and (2):

$$\rho(x', y') = \sum_{j=1}^{N} S_j g_j^*(x', y'). \quad (3)$$

By introducing the equations (1) and (2) into the equation (3), the equation (3) is rewritten as follows:

$$\rho(x', y') = \int dx\, dy\, h(x', y'; x, y) \rho(x, y) \quad (4)$$

where $h(x', y'; x, y)$ is a point spread function defined by $$h(x', y'; x, y) = \sum_{j=1}^{N} \exp[-2\pi i \gamma \{k_x(t_j)(x - x') + k_y(t_j)(y - y') + (\Delta H(x, y) - \Delta H(x', y'))t_j\}]. \quad (5)$$

From the equation (5), it can be understood that the frequency characteristic of the point spread function h is determined by the set $\{(\gamma k_x(t_j), \gamma k_y(t_j)), j=1, 2, \ldots N\}$ of sample points in a two-dimensional Fourier plane in the case of excepting the term of the inhomogeneity.

A point spread function $\bar{h}(x', y'; x, y)$ in the case where the image reconstruction is made through a correlation $$\sum_{j=1}^{N} W_j(x', y') S_j g_j^*(x', y')$$

using a weighing factor $W_j(x', y')$, is represented by $$\bar{h}(x', y'; x, y) = \sum_{j=1}^{N} W_j(x', y') \exp[-2\pi i \gamma \{k_x(t_j) \cdot (x - x') + k_y(t_j)(y - y')\}]. \quad (5')$$

The frequency characteristic of the point spread function can be controlled by properly selecting the value of $W_j(x', y')$. For example, if $W_j$ is selected to be the reciprocal of the density of sample points at $(k_x(t_j), k_y(t_j))$, the frequency characteristic of $\bar{h}$ can be flattened. If $W_j$ is selected to have smaller values for $(k_x(t_j), k_y(t_j))$ distanced from the origin, h having an enhanced low-frequency region is obtained.

In general, the S/N ratio in the detected signal $S_j$ degrades as $(k_x(t_k), k_y(t_j))$ is distanced from the origin. Therefore, the S/N ratio of a reconstruction image, too, can be controlled by $W_j$. It is of course that the point spread function and/or the S/N ratio can be controlled for each position on the reconstruction image by changing $W_j(x', y')$ in accordance with $(x', y')$.

Next, consider the term of the static magnetic field inhomogeneity. Since h in the equation (5) has a large value only at $x \simeq x'$ and $y \simeq y'$, the following approximation can be satisfied:

$$\Delta H(x, y) - \Delta H(x', y') \simeq \Delta H_x \cdot (x-x') + \Delta H_y \cdot (y-y') \quad (6)$$

where $$\Delta H_x = \frac{\partial \Delta H(x, y)}{\partial x} \bigg|_{\substack{x=x' \\ y=y'}}$$

$$\Delta H_y = \frac{\partial \Delta H(x, y)}{\partial y} \bigg|_{\substack{x=x' \\ y=y'}}$$

Accordingly, the equation (5') can be rewritten as follows:

$$h(x', y'; x, y) \simeq \sum_{j=1}^{N} W_j(x', y') \exp[-2\pi i \gamma \{(k_x(t_j) + \Delta H_x t_j)(x-x') + (k_y(t_j) + \Delta H_y t_j)(y-y')\}]. \quad (5'')$$

The equation (5'') shows that the static magnetic field inhomogeneity has an effect of shifting the sample point $(k_x(t_j), k_y(t_j))$ to $(k_x(t_j) + \Delta H_x t_j, k_y(t_j) + \Delta H_y t_j)$. For this shift, the density of sample points changes and the frequency characteristic of $\tilde{h}$ changes in accordance with a location $(x', y')$ but the change of the sample density can be cancelled by $W_j(x', y')$, thereby correcting the effect of the static magnetic field inhomogeneity. The first embodiment of the present invention will now be explained in detail referring to FIGS. 1 to 5. FIG. 1 shows a block diagram of an NMR imaging system which embodies the present invention. For the detection of an NMR signal from an object of interest, the system comprises a sequence controller 21 for controlling parts of the system in accordance with a predetermined procedure, a transmitter 22 for generating and transmitting RF (high frequency) magnetic field pulses to cause nuclear magnetic resonance (NMR), a gradient magnetic field driver 24 for driving gradient magnetic fields, a magnetic field controller 23 for controlling the gradient magnetic field driver 24, a receiver 25 for receiving and detecting an NMR signal generated from the object, a processor 25 for performing an image reconstruction and various operations, a CRT 27 for image display, and an external memory 28 for storing data of the detected signal, data of the reconstruction image, etc. Coils for generating the static magnetic field are omitted in FIG. 1, because the control of the coils is not necessary.

Figure 2:
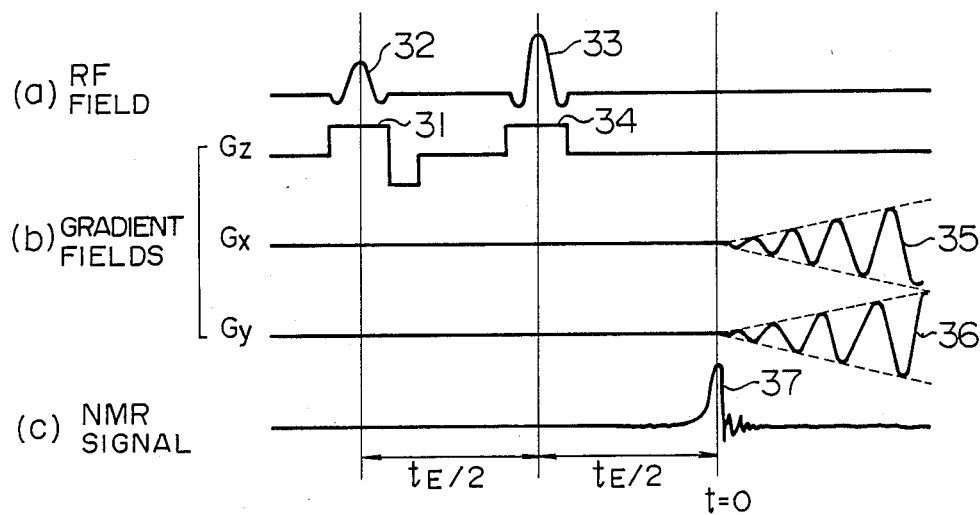
FIG. 2 is a time chart showing an example of a pulse sequence used in the signal measurement according to a first embodiment of the present invention.

FIG. 2 shows an example of a pulse sequence by which the first embodiment of the present invention is realized in the system having the above-mentioned construction. First, a gradient magnetic field pulse $G_z$ 31 in the z-direction is applied and at the same time a 90° RF magnetic field pulse 32 is generated, thereby causing resonance of spins in a slice to be imaged. Next, a 180° RF magnetic field pulse 33 for generating a spin echo is applied together with a gradient magnetic field pulse $G_z$ 34 in the z-direction. Thereafter, an NMR signal 37 is measured while applying a time-varying gradient magnetic field $G_x(t)$ 35 in the x-direction and a time-varying gradient magnetic field $G_y(t)$ 36 in the y-direction. Here, $G_x(t)$ and $G_y(t)$ are selected as follows:

$$G_x(t) = \eta \cos \xi t - \eta \xi t \sin \xi t \quad G_y(t) = \eta \sin \xi t - \eta \xi t \cos \xi t \quad (7)$$

where $\eta$ and $\xi$ are constants. Accordingly, $k_x(t)$ and $k_y(t)$ are represented by $$k_x(t) = \int_0^t G_x(t') dt' = \eta t \cos \xi t \quad (8)$$

$$k_y(t) = \int_0^t G_y(t') dt' = \eta t \cos \xi t.$$

Figure 3:
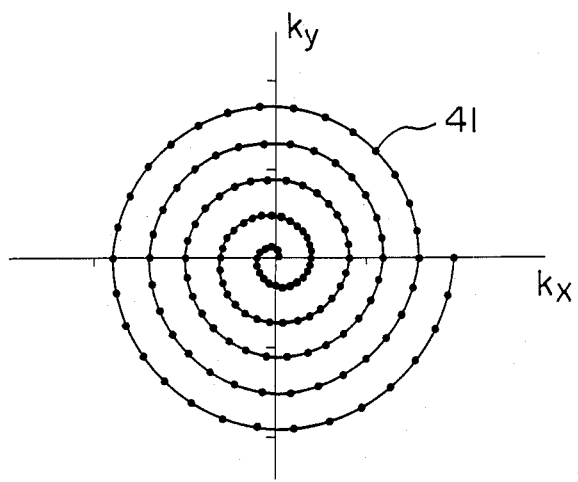
FIGS. 3 and 4 are views showing the distributions of sample points in a two-dimensional Fourier plane.
Figure 4:
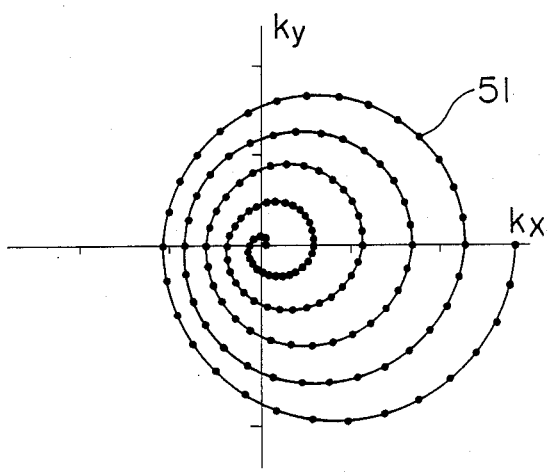

FIG. 3 shows the distribution of sample points $(k_x(t_j), k_y(t_j))$ when no static magnetic field inhomogeneity is present. The density of sample points 41 is proportional to $(k_x(t_j)^2 + k_y(t_j)^2)^{\frac{1}{2}} = (\eta t_j)^{-1}$. FIG. 4 shows an example of the distribution of sample points when the static magnetic field inhomogeneity is present. In the figure, $\Delta H_x \neq 0$ and $\Delta H_y = 0$ are assumed. In general, the density of sample points 51 when the static magnetic field inhomogeneity is present, is proportional to $$(k_x(t_j)^2 + k_y(t_j)^2)^{-\frac{1}{2}} \left(1 + \frac{\Delta H_x}{\eta} \cos \theta_j - \frac{\Delta H_y}{\eta} \sin \theta_j \right)^{-1}$$

where $\theta_j$ is equal to $\tan^{-1}(k_y(t_j)/k_x(t_j))$. Namely, it is proportional to $$(\eta t_j)^{-1} \left(1 + \frac{\Delta H_x}{\eta} \cos \xi t_j - \frac{\Delta H_y}{\eta} \sin \xi t_j \right)^{-1}.$$

Figure 5:
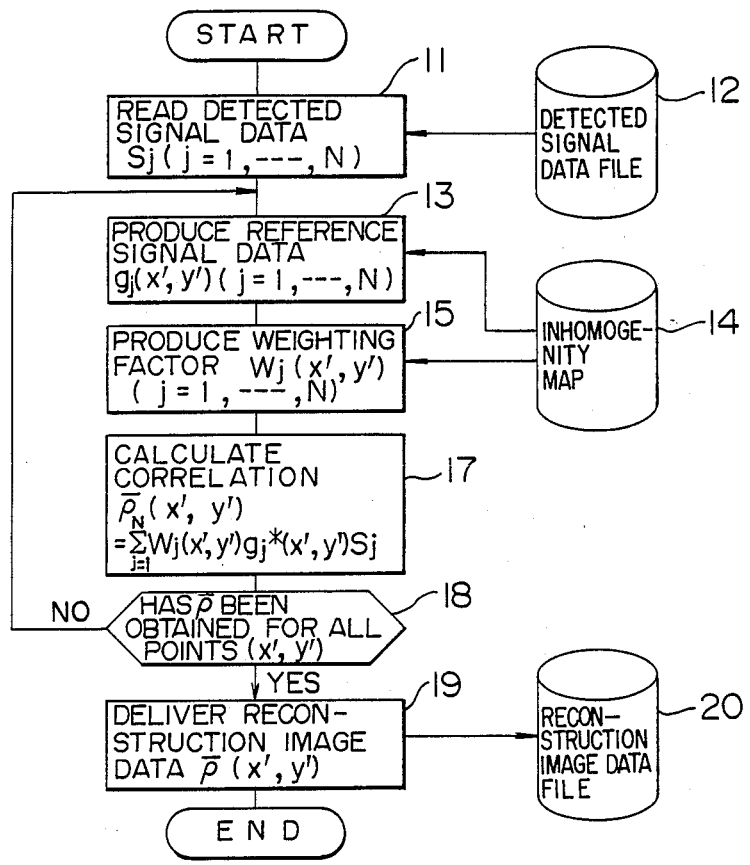
FIG. 5 is a flow chart showing a processing for image reconstruction in the first embodiment of the present invention.

A flow chart of the procedure of an image reconstruction processing by the processor 26 based on the above-mentioned pulse sequence is shown in FIG. 5. Referring to FIG. 5, detected signal data $S_j$ ($j = 1, 2, \ldots, N$) to be reconstructed is read from a detected signal data file 12 in the external memory 28 and stored in a memory of the processor 26 (step 11). In step 13, the static magnetic field inhomogeneity $\Delta H (x', y')$ at a position $(x', y')$ is read from a magnetic field inhomogeneity map 14 in the external memory 28 and is used to produce a reference signal $$g_j(x', y') = \exp[-2\pi i \gamma \{\eta t_j \cos(\xi t_j) \cdot x' + \eta t_j \sin(\xi t_j) \cdot y' + \Delta H(x', y') t_j\}]$$

$$j = 1, 2, \ldots, N.$$

Thereafter, in step 15, the rate of change $\Delta H_x (x', y')$, $\Delta H_y (x', y')$, in the static magnetic field inhomogeneity degree is read from the magnetic field inhomogeneity map 14 to produce a weighting factor $$W_j(x', y') = \eta t_j \cdot \left(1 + \frac{\Delta H_x}{\eta} \cos(\xi t_j) - \frac{\Delta H_y}{\eta} \sin(\xi t_j)\right)$$

$$j = 1, 2, \ldots, N.$$

In step 17, the following correlation $$\rho(x', y') = \sum_{j=1}^{N} S_{gj}^{*}(x', y') W_j(x', y')$$

is calculated, thereby obtaining the value of a reconstruction image at (x', y').

Step 18 determines whether or not ρ has been obtained for all points (x', y') of the reconstruction image. If the result is "NO", the process is returned to step 13 to repeat a similar processing for the next point (x', y'). When the result is "YES", the process proceeds to step 19. In step 19, data ρ(x', y') of the reconstruction image is delivered to a reconstruction image data file 20 of the external memory 28 for storing therein and/or to the CRT 27 for display, thereby completing a series of image reconstruction processings.

According to the first embodiment of the present invention as has been described above, there can be obtained a reconstruction image which has its point spread function with a flat frequency characteristic and is free of the effect of the static magnetic field inhomogeneity.

Though in the first embodiment the frequency characteristic of the point spread function has been made flat, it is of course that a reconstruction image having its point spread function with an enhanced low-frequency range or enhanced high-frequency range depending on the requirements for the S/N ratio can be readily obtained by merely changing the weighting factor $W_j(x', y')$. Further, a method using an echo signal derived from the inversion of gradient magnetic fields may be employed in place of the method using spin echoes caused by the 180° RF magnetic field pulse as shown in FIG. 2, the gradient magnetic fields can be controlled by a method other than the equation (7), and the above-described argument concerning the two-dimensional case may be expanded to the three- or more higher dimensional case. Those alternatives provide effects similar to those in the first embodiment. Furthermore, it is of course that if the reference signal data and the weighting factor(s) are preliminarily produced and stored in the external memory 28, the number of operations required for image reconstruction can be saved.

According to the first embodiment of the present invention and its modifications, since the point spread function and/or S/N ratio at each point on the reconstruction image can be easily controlled and the effect of the static magnetic field inhomogeneity can be corrected by using the weighting factor in calculating the correlation of the detected signal data and the reference signal data for image reconstruction, there is realized an NMR imaging system which can meet the variations in characteristics of the system and/or the user's demands and is capable of reconstructing an image with high quality.

Next, a second embodiment of the present invention will be described in conjunction with a two-dimentional tomographic imaging. The following argument will be equally valid in the three-dimensional case.

Now assume that a two-dimensional coordinate system is established in an xy cross section and the intensities of gradient magnetic fields in the x- and y-directions are $G_x(t)$ and $G_y(t)$, respectively. Then, a detected NMR signal $S_i(t)$ is represented by $$S_1(t) = C \sum_n \int dx dy \rho_n(x,y) \exp[-2\pi i \gamma \{k_x(t)x + k_y(t)y + \Delta H_o(x, y)t + \Delta H_n t\} - (t + t_E)/T_2(x, y)] \quad (9)$$

$$(0 \leq t \leq T)$$

where $k_x(t)$ and $k_y(t)$ is defined by $$k_x(t) = \int_0^t G_x(t') dt'$$

$$k_y(t) = \int_0^t G_y(t') dt',$$

$\gamma$ is the gyromagnetic ratio, $\rho_n(x, y)$ is the spin density of the n-th chemical shift component at a position (x, y), $\Delta H_o$ is the degree of inhomogeneity of a static magnetic field $\Delta H_n$ is the chemical shift, $T_2(x, y)$ is the spin-spin relaxation constant at the point (x, y), $t_E$ is the echo time, T is the measurement interval, C is a proportional constant, and i is the unit of an imaginary number equal to $\sqrt{-1}$. The effect of longitudinal relaxation and the effect or artifact of movement are omitted from the equation (9). An NMR signal $S_2(t)$ measured when the timing of data measurement is delayed by $\Delta T$ can be represented by $$S_2(t) = C \sum_n \int dx dy \rho_n(x, y) \exp[-2\pi i \gamma \{k_x(t)x + k_y(t)y + \Delta H_o(x, y)(t + \Delta T)t + \Delta H_n(t + \Delta T)\} - (t + t_E + \Delta T)/T_2(x, y)] \quad (10)$$

$$(0 \leq t \leq T).$$

By calculating a difference between the equations (9) and (10) and assume $\Delta T <> (\gamma \Delta H_o)^{-1}, (\gamma \Delta H_n)^{-1}, T_2(x, y)$ we get $$S_1(t) - S_2(t) \simeq C \sum_n \int dx dy \rho_n(x, y) \cdot \exp[-2\pi i \gamma \{k_x(t)x + k_y(t)y + \Delta H_o(x, y)t + \Delta H_n t\} - (t + t_E)/T_2(x, y)] \cdot (+2\pi i \gamma (\Delta H_o(x, y) + \Delta H_n) + 1/T_2(x, y))\Delta T. \quad (11)$$

Further assume $T << (\gamma \Delta H_o)^{-1}, (\gamma \Delta H_n)^{-1}, T_2(x, y)$, the equation (9) can be rewritten as follows:

$$S_1(t) \simeq C \sum_n \int dx dy \rho_n(x, y) \exp[-2\pi i \gamma \{k_y(t)x + k_y(t)y\} - t_E T_2(x, y)] \cdot (1 - 2\pi i \gamma (\Delta H_o(x, y) + \Delta H_n)t - t/T_2(x, y)). \quad (12)$$

Thus, we get $$S(t) \underset{def}{=} S_1(t) + \frac{t}{\Delta T}(S_1(t) - S_2(t)) \simeq \quad (13)$$

$$C \sum_n \int dx dy \rho_n(x, y) \exp[-2\pi i \gamma \{k_x(t)x +$$

-continued
$$k_y(t)y\} - t_E/T_2(x, y)].$$

Accordingly, by reconstructing an image by use of $\bar{S}(t)$, the effect of relaxation time, chemical shift and/or static magnetic field inhomogeneity, that is, any change in intensity of an NMR signal during a measurement time due to such an effect can be corrected, thereby acquiring an image with high quality. Also, if such an image is combined with an image obtained in a similar manner while changing $t_E$, a relaxation time image can be obtained with high accuracy. Similarly, a chemical shift image or a static magnetic field inhomogeneity map can be obtained with high accuracy by using the commonly known techniques to obtain a chemical shift image or a static magnetic field inhomogeneity map.

If the correction for a higher-order term is desired, that is, when a term of $(\Delta T)^2$ should be taken into consideration for the equation (11), we get $$S_1(t) - S_2(t) \simeq C \sum_n \int dx dy \, \rho_n(x, y) \exp\left[-2\pi i \gamma \{k_x(t)x + \right. \tag{14}$$

$$k_y(t)y + \Delta H_0(x, y)t + \Delta H_n t\} - (t + t_E)/T_2(x, y)] \cdot$$

$$\{(2\pi i \gamma(\Delta H_0(x, y) + \Delta H_n) + 1/T_2(x, y)\Delta T +$$

$$(2\pi i \gamma(\Delta H_0(x, y) + \Delta H_n) + 1/T_2(x, y))^2 \Delta T^2\}.$$

An NMR signal $S_3(t)$ is measured while delaying the timing of data measurement by $\Delta T'$ ($\neq \Delta T$), and a difference between $S_1(t)$ and $S_3(t)$ is calculated to produce $S_1(t) - S_3(t)$ which corresponds to the equation (14) excepting a change from $\Delta T$ to $\Delta T'$ in the right side. Thus, we get $$\frac{1}{\Delta T - \Delta T'}\left(\frac{\Delta T}{\Delta T}(S_1(t) - S_2(t)) - \frac{\Delta T}{\Delta T'}(S_1(t) - S_3(t))\right) = \tag{15}$$

$$C \sum_n \int dx dy \, \rho_n(x, y) \exp\left[-2\pi i \gamma \{k_x(t)x + k_y(t)y + \right.$$

$$\Delta H_0(x, y)t + \Delta H_n t\} - (t + t_E)/T_2(x, y)] \cdot$$

$$\{2\pi i \gamma(\Delta H_0(x, y) + \Delta H_n) + 1/T_2(x, y)\}$$

$$\frac{1}{\Delta T - \Delta T'}\left(\frac{S_1(t) - S_2(t)}{\Delta T} - \frac{S_1(t) - S_3(t)}{\Delta T'}\right) = \tag{16}$$

$$C \sum_n \int dx dy \, \rho_n(x, y) \exp[-2\pi i \gamma \{k_x(t)x + k_y(t)y +$$

$$\Delta H_0(x, y)t + \Delta H_n t\} - (t + t_E)/T_2(x, y)] \cdot$$

$$\{2\pi i \gamma(\Delta H_0(x, y) + \Delta H_n) + 1/T_2(x, y)\}^2$$

Therefore, if the following $S(t)$ $$S(t) \underset{def}{=} S_1(t) + \tag{17}$$

$$\frac{t}{\Delta T - \Delta T'}\left(\frac{\Delta T}{\Delta T}\left(S_1(t) - S_2(t) - \frac{\Delta T}{\Delta T'}S_1(t) - S_3(t)\right)\right) +$$

-continued $$\frac{t^2}{\Delta T - \Delta T'}\left(\frac{1}{\Delta T}S_1(t) - S_2(t) - \frac{1}{\Delta T'}(S_1(t) - S_3(t))\right)$$

is used, it is apparent that the correction up to the higher-order term as compared with the equation (13) can be effected. The correction for the third-order or higher order term can be similarly made.

The second embodiment of the present invention will now be explained in detail referring to FIGS. 1 and 6 to 9.

Figure 6:
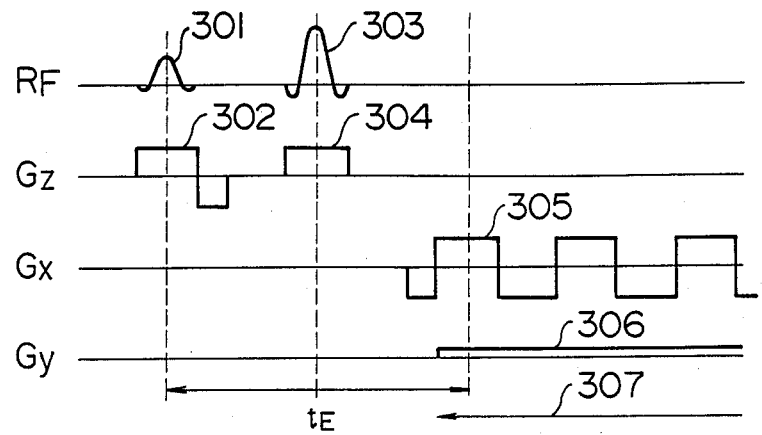
FIGS. 6 and 7 are time charts showing generally an example of a pulse sequence used in the signal measurement according to a second embodiment of the present invention.
Figure 7:
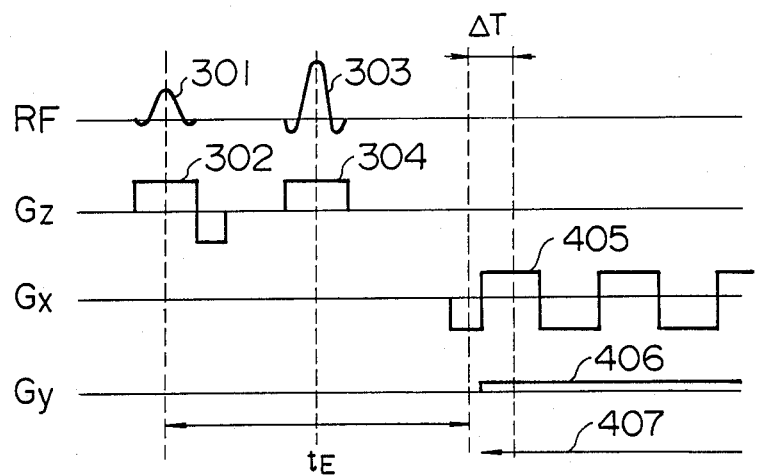

FIGS. 6 and 7 show generally an example of a pulse sequence by which the second embodiment of the invention is realized in the NMR system having the construction shown in FIG. 1. FIG. 6 is the pulse sequence in accordance with which a reference NMR signal $S_1(t)$ is measured. First, a gradient magnetic field pulse $G_z$ 302 in the z-direction is applied and at the same time a 90° RF magnetic field pulse 301 is generated, thereby causing the resonance of spins in a slice to be imaged. Then, a 180° RF magnetic field pulse 303 for causing the generation of a spin echo is applied together with a gradient magnetic field pulse $G_z$ 304 in the z-direction. Thereafter, an NMR signal is measured for a period of time 307 while applying a gradient magnetic field $G_x$ 305 in the x-direction and a gradient magnetic field $G_y$ 306 in the y-direction.

FIG. 7 is the pulse sequence in the case where the timing of data measurement is delayed by $\Delta T$. The sequence of FIG. 7 is the same as that of FIG. 6 excepting that the timings of a gradient magnetic field $G_x$ 405 in the x-direction, a gradient magnetic field $G_y$ 406 in the y-direction and the start of a data measurement period of time 407 are delayed by $\Delta T$.

The signal measured in accordance with the sequence shown in FIG. 6 is used as $S_1(t)$ for signal processing while signals measured at the cases of $\Delta T = \Delta T_2$, $\Delta T_3$ and $\Delta T_4$ in accordance with the sequence shown in FIG. 7 are used as $S_2(t)$, $S_3(t)$ and $S_4(t)$, respectively, for signal processing.

FIG. 8 is a flow chart showing the procedure of processing in the present embodiment. In step 101, signal data $S_i(t)$ (i=1, ..., 4) measured in accordance with the sequence shown in FIGS. 6 and 7 are read from the external memory 28 (see FIG. 1) and are stored in a memory of the processor 26. In step 102, steps 103 and 104 are repeated for all sample points j. More especially, in step 103, the gradient a of $S_i(t_j)$ regarded as a function of $\Delta T$ is estimated from the four sample data $S_i(t_j)$ ($t_j$: the j-th sampling instant of time), taking noises and $\Delta T_2$, $\Delta T_3$ and $\Delta T_4$ into consideration. In step 104, the gradient a is used to produce $$S(t_j) = S_1(t_j) - a \cdot t_j, \tag{18}$$

thereby obtaining corrected signal data $S(t_j)$.

In step 105, an image is reconstructed from the corrected signal data $\bar{S}$. In step 106, data of the reconstruction image is delivered to the external memory 28 for storing therein and/or to the CRT 27 for display.

FIG. 9 shows an example of a processing performed in step 103 of FIG. 8. $S_1(t_j)$, $S_2(t_j)$, $S_3(t_j)$ and $S_4(t_j)$ corresponding to $\Delta T = 0$, $\Delta T_2$, $\Delta T_3$ and $\Delta T_4$ are regarded as a function of $\Delta T$ and the gradient of a straight line representing the best approximation of that function is estimated as the value of a. The gradient a can be determined by use of, for example, the least square method.

A value of the thus obtained straight line at $\Delta T = -t_j$ can be employed as corrected signal data $S(t_j)$ instead of the equation (18).

According to the above-described second embodiment, there is obtained a reconstruction image in which the degradation of quality of the image is corrected. A similar effect can be attained in the case where the imaging is made using a pattern of gradient magnetic fields different from that in FIG. 6 or 7 and in the case where an echo signal derived from the inversion of gradient magnetic field is measured in place of the echo signal caused by the 180° RF magnetic field pulse.

Since the image quality degradation can be corrected in the second embodiment, if this image is combined with an image obtained in a similar manner while changing the echo time $t_E$, $T_2$ can be measured with higher accuracy.

The above-mentioned processing can be also carried out for operations on the image after reconstruction. Namely, when an operation of reconstruction is represented by R and since R is linear operator, the equation (13) can be rewritten as $$R(S(t)) = R(S_1(t)) + \frac{1}{\Delta T} R(tS_1(t) - tS_2(t)). \quad (19)$$

In the equation (19), the left side represents the image in which the quality degradation is corrected, while the first term of the right side represents an uncorrected image and the second term thereof represents a correction term. In other words, the correction of the image quality degradation can be effected by calculating the second term of the right side of the equation (19) and adding the result of calculation to the uncorrected image. This approach can achieve the same effect as that which has been mentioned in conjunction with the second embodiment.

According to the second embodiment and its modifications, the effect of relaxation, chemical shift and/or static magnetic field inhomogeneity that an NMR signal changes during signal measurement with the result of degradation of the image quality, can be corrected by estimating such an effect from a plurality of NMR signals measured with different measurement start timings. As a result, a reconstruction image having a high quality can be acquired and the relaxation, chemical shift and/or static magnetic field inhomogeneity can be measured with high accuracy by use of this image.

A third embodiment of the present invention will now be described in conjunction with a two-dimensional tomographic imaging. The following argument will be equally valid in the one-dimensional and three-dimensional cases.

Assume that a two-dimensional coordinate system is established for an xy plane, the velocities in the x- and y-directions are $v_x$ and $v_y$, and the intensities of gradient magnetic fields in the x- and y-directions are $G_x(t)$ and $G_y(t)$, an NMR signal $S(t)$ after detection can be represented by $$S(t) = C \int dx dy dv_x dv_y \, \rho(x, y, v_x, v_y) \cdot \quad (20)$$

$$\exp\left[ -2\pi i \gamma \int_0^t \{G_x(t')(x + v_x t') + G_y(t')(y + v_y t')\} dt' \right]$$

where $\gamma$ is the gyromagnetic ratio, $\rho(x, y, v_x, v_y)$ is the density of spins having a position (x, y) and a velocity $(v_x, v_y)$ at t=0, C is a proportional constant, and i is the unit of an imaginary number equal to $\sqrt{-1}$. The effects of $T_1$ and $T_2$ relaxation times and static magnetic field inhomogeneity are omitted from the equation (20) since those effects can be neglected if measurement time is sufficiently short. Further, it is assumed that the spin velocity is constant within the measurement time.

The equation (20) can be rewritten as $$S(t) = C \int dx \, dy \, dv_x dv_y \rho(x, y, v_x, v_y) \cdot \exp[-2\pi i \{k_x(t)x + k_{vx}(t) + k_y(t)y + k_{vy}(t)v_y\}] \quad (21)$$

where $k_x(t)$, $k_{vx}(t)$, $k_y(t)$ and $k_{vy}(t)$ are defined by $$k_x(t) = \gamma \int_0^t G_x(t') dt'$$

$$k_{vx}(t) = \gamma \int_0^t G_x(t') t' dt'$$

$$k_y(t) = \gamma \int_t^0 G_y(t') dt'$$

$$k_{vy}(t) = \gamma \int_0^t G_y(t') t' dt'$$

On the other hand, a reference signal, i.e., an NMR signal generated from spins having a position (x', y') and a velocity $(v_x', v_y')$ at t=0 is represented by $$g(t, x', y', v_x', v_y') = \exp[-2\pi i \{k_x(t)x' + k_{vx}(t)v_x' + k_y(t)y' + k_{vy}(t)v_y'\}]. \quad (22)$$

Accordingly, the correlation of the equations (21) and (22) results in $$\int dt S(t) g^*(t, x', y', v_x', v_y') = \quad (23)$$

$$C \int dy dy dv_x dv_y h(x' - x, y' - y, v_x' - v_x, v_y' - v_y) \cdot \rho(x, y, v_x, v_y)$$

where the function h is defined by $$h(x' - x, y' - y, v_x' - v_x, v_y' - v_y) = \quad (24)$$

$$\int dt \exp\left[-2\pi i \{k_x(t)(x - x') + k_{vx}(t)(v_x - v_x') + k_y(t)(y - y') + k_{vy}(t)(v_y - v_y')\right]$$

According to the equation (23), the density of spins having the position (x', y') and the velocity $(v_x', v_y')$ can be measured with the function h of the equation (24) as a point spread function.

Alternatively, in the case where only spins existing in a cross section of $|y| < Y/2$ are selectively excited to observe an NMR signal and the imaging is performed for only the position x and the velocity $v_y$ in a direction perpendicular to the cross section under a condition that the velocity $v_x$ in a direction of the cross section is neglected, the equation (20) can be rewritten as $$S(t) = C \int dx dv_y \rho(x, v_y) \exp[-2\pi i \{k_x(t)x + k_{vy}(t)v_y\}]. \quad (25)$$

As a result, the position x and the velocity vy can be simultaneously imaged in a similar manner to the equations (20) to (24).

Next, the third embodiment of the present invention will be explained in detail referring to FIGS. 1 and 10 to 12.

Figure 10:
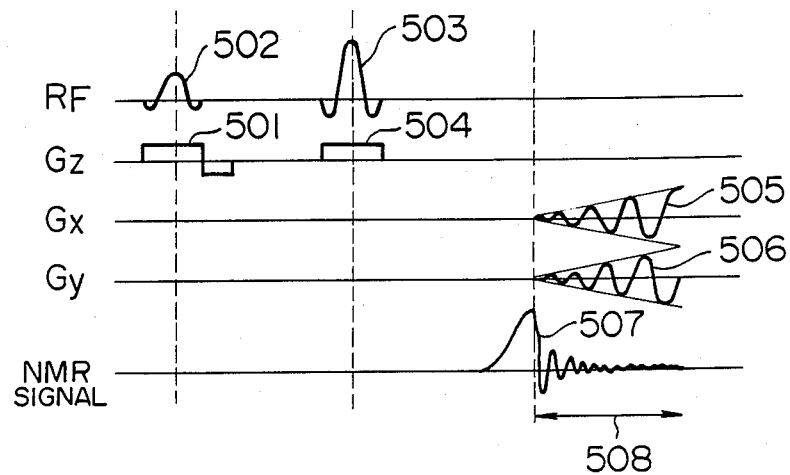
FIGS. 10 and 11 are time charts showing different examples of a pulse sequence used in the signal measurement according to a third embodiment of the present invention.

FIG. 10 shows an example of a pulse sequence by which the third embodiment of the invention is realized in the NMR system having the construction shown in FIG. 1. First, a gradient magnetic field pulse $G_z$ 501 in the z-direction is applied and at the same time a 90° RF magnetic field pulse 502 is generated, thereby causing the resonance of spins in a slice to be imaged. Next, a 180° RF magnetic field pulse 503 for causing the generation of a spin echo is applied together with a gradient magnetic field pulse $G_z$ 504 in the z-direction. Thereafter, an NMR signal 507 is measured for a period of time 508 while applying a time-varying gradient magnetic field $G_x(t)$ in the x-direction and a time-varying gradient magnetic field $G_y(t)$ 506 in the y-direction. $G_x(t)$ and $G_y(t)$ are selected to be $$G_x(t) = \rho \cos \xi t - \rho \xi t \sin \xi t$$

$$G_y(t) = \rho \sin \xi t - \rho \xi t \cos \xi t \qquad (26)$$

where $\rho$ and $\xi$ are constants. Accordingly, we get $$k_x(t) = \int_0^t G_x(t')dt' = \eta t \cos\xi t \qquad (27)$$

$$k_y(t) = \int_0^t G_y(t')dt' = \eta t \sin\xi t$$

$$k_{vx}(t) = \int_0^t G_x(t')t'dt' = -\frac{\eta t}{\xi}\sin\xi t + \eta\left(t^2 - \frac{1}{\xi^2}\right)\cos\xi t$$

$$k_{vx}(t) = \int_0^t G_y(t')t'dt' = \eta\left(t^2 - \frac{1}{\xi^2}\right)\sin\xi t + \frac{\eta t}{\xi}\cos\xi t$$

Figure 12:
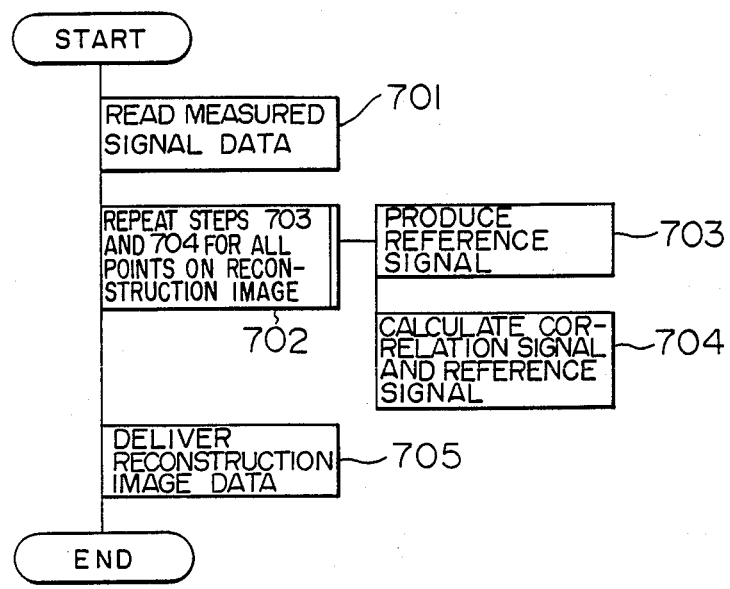
FIG. 12 is a flow chart showing a processing for image reconstruction in the third embodiment of the present invention.

FIG. 12 shows a flow chart of the procedure of an image reconstruction processing performed by the processor 26 of FIG. 1 in accordance with the sequence shown in FIG. 10. First, in step 701, data of measured signal stored in the external memory 28 is read and stored in a memory of the processor 26. Next, in step 702, steps 703 and 704 are repeated for each point $(x_i=i\Delta x, y_j=j\Delta y, v_{x,l}=l\Delta v_x, v_{y,m}=m\Delta v_y)$ (i, j, l, m=0, 1, 2, 3, ..., and $\Delta x$, $\Delta y$, $\Delta v_x$, $\Delta v_y$: the resolution of each variable) on a reconstruction image. More especially, in step 703, a reference signal $g(t; x_i, y_j, v_{x,l}, v_{y,m})$ for a point $(x_i, y_j, v_{x,l}, v_{y,m})$ to be reconstructed is produced in accordance with the following equation:

$g(t; x_i, y_j, v_{x,l}, v_{y,l})=\exp[-2\pi i\{k_x(t)x_i+k_y(t)y_j+kv_x(t)v_{x,l}+kv_y(t-)v_{y,m}\}]$ In step 704, the following correlation of the measured signal S(t) read in step 701 and the reference signal $g(t; x_i, y_j, v_{x,l}, v_{y,m})$ $\int dt\, S(t)g^*(t; x_i, y_j, x_{x,l}, v_{y,m})$ is calculated as a value of the reconstruction image at the point $(x_i, y_j, v_{x,l}, v_{y,m})$.

In step 705, reconstruction image data obtained as the result of repetition in step 702 is delivered to the external memory 28 and/or the CRT 27 (see FIG. 1).

With the above-described procedure, the position (x, y) and the velocity $(v_x, v_y)$ are simultaneously imaged.

Figure 11:
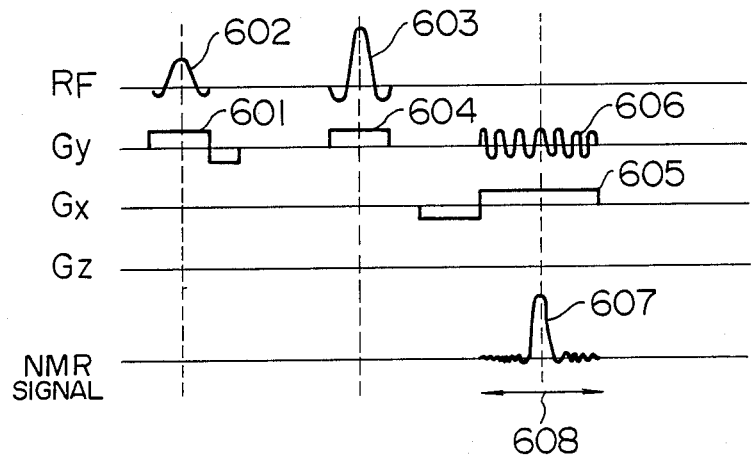

FIG. 11 shows a sequence in the case where only the position x and the vy are to be imaged. A 90° RF magnetic field pulse 602 is generated simultaneously with the application of a gradient magnetic field pulse Gy 601 in the y-direction, thereby causing the resonance of spins in a slice to be imaged. Next, a 180° RF magnetic field pulse 603 for generating a spin echo and a gradient magnetic field pulse $G_y$ 604 in the y-direction are simultaneously applied. Thereafter, a constant gradient magnetic field $G_x$ 605 in the x-direction and a time-varying gradient magnetic field $G_y(t)$ 606 in the y-direction is applied before or after the instant of generation of the spin echo to measure an NMR signal 607 for a period of time 608. $G_y(t)$ is selected to be $$G_y(t) = \eta \sin \xi t. \qquad (28)$$

Accordingly, $dv_y(t)$ is $$k_{vy}(t) = \int_0^t G_y(t')t'dt' = -\frac{\eta t}{\xi}\cos\xi t + \frac{\eta}{\xi^2}\sin\xi t. \qquad (29)$$

The procedure of an image reconstruction processing in accordance with the sequence shown in FIG. 11 is similar to that shown in FIG. 12 and described above. However, since no imaging for the position y is required because only spins in the slice in the y-direction are selectively resonated, the following reference signal for only the position $x_i$ and the velocity $v_{y,j}(x_i=i\Delta x, v_{y,j}=j\Delta v_y)$ $g(t; x_i, v_{y,j})=\exp[-2\pi i\{G_x tx_i+k_{vy}(t)v_{y,j}\}]$ is produced and a calculation for image reconstruction is performed by use of this reference signal.

Though in the third embodiment the echo signal has been measured by use of the 180° magnetic field pulse, the echo signal can be derived from the inversion of the gradient magnetic fields. The imaging may also be carried out by using a variation pattern of gradient magnetic fields different from that shown by the equation (26) or (28). Either case provides an effect similar to that described in conjunction with the third embodiment.

According to the third embodiment and its modifications, the position and the velocity can be simultaneously measured and imaged in an NMR imaging system. As a result, a time require for data measurement can be greatly reduced.

We claim:

1. An image reconstruction method in a nuclear magnetic resonance imaging system comprising magnetic field generating means for generating a static magnetic field, time-varying gradient magnetic fields and an RF magnetic field, means for controlling said magnetic field generating means in accordance with a predetermined procedure, means for detecting a nuclear magnetic resonance signal from a desired region in an object of interest, means for converting the detected signal into digital data, and means for performing various operations on the digital data, said method comprising:

a step of producing reference signal data at any given position in the object region defined by the gradient magnetic fields; and a step of calculating a correlation of the produced reference signal data, a predetermined weighting factor and said digital data, thereby reconstructing an image of the object region.

2. An image reconstruction method according to claim 1, wherein at the calculating step, the correlation of said digital data with the result of multiplication of said reference signal data by said predetermined weighting factor is calculated.

3. An image reconstruction method according to claim 2, wherein said weighting factor is determined in accordance with requirements for at least one of a point spread function and a signal-to-noise ratio in a reconstruction image.

4. An image reconstruction method according to claim 2, wherein said weighting factor is different for respective points on a reconstruction image.

5. An image reconstruction method according to claim 2, wherein said weighting factor is determined in accordance with the static magnetic field inhomogeneity at each point on a reconstruction image.

6. An image reconstruction method according to claim 1, wherein at the calculating step, the correlation of said reference signal data with the result of multiplication of said digital data by said predetermined weighting factor is calculated.

7. An image reconstruction method according to claim 6, wherein said weighting factor is determined in accordance with requirements for at least one of a point spread function and a signal-to-noise ratio in a reconstruction image.

8. An image reconstruction method according to claim 6, wherein said weighting factor is different for respective points on a reconstruction image.

9. An image reconstruction method according to claim 6, wherein said weighting factor is determined in accordance with the static magnetic field inhomogeneity at each point on a reconstruction image.

10. An image reconstruction method in a nuclear magnetic resonance imaging system comprising magnetic field generating means for generating a static magnetic field, gradient magnetic fields and an RF magnetic field, means for controlling said magnetic field generating means in accordance with a predetermined procedure, means for detecting nuclear magnetic resonance signals from an object of interest, and means for performing an operation inclusive of image reconstruction for the detected signals, said method comprising:

a step of measuring the nuclear magnetic resonance signals at different timings;

a step of estimating the effect of at least one of relaxation, a chemical shift and the inhomogeneity of the static magnetic field to the nuclear magnetic resonance signal from a set of the measured nuclear magnetic resonance signals;

a step of using the result of estimation to produce a corrected nuclear magnetic resonance signal in which said effect is corrected; and a step of reconstructing an image of a desired region of the object on the basis of the corrected nuclear magnetic resonance signal.

11. An image reconstruction method according to claim 10, wherein the estimating step includes producing at least one of a relaxation time image, a chemical shift image and a map of the static magnetic field inhomogeneity.

12. An image reconstruction method according to claim 10, wherein said effect of at least one of the relaxation, the chemical shift and the static magnetic field inhomogeneity is corrected by an operation for the image after reconstruction.

13. An image reconstruction method according to claim 11, wherein said effect of at least one of the relaxation, the chemical shift and the static magnetic field inhomogeneity is corrected by an operation for the image after reconstruction.

14. An image reconstruction method in a nuclear magnetic resonance imaging system comprising magnetic field generating means for generating a static magnetic field, gradient magnetic fields and an RF magnetic field, means for controlling said magnetic field generating means in accordance with a predetermined procedure, means for detecting a nuclear magnetic resonance signal from an object of interest, and means for performing various operations on the detected signal, said method comprising:

a step of detecting the nuclear magnetic resonance signal while making a time variation in the gradient magnetic fields;

a step of producing as a reference signal a nuclear magnetic resonance signal generated from nucleus spins having a velocity at any given position in a desired region of the object;

a step of calculating a correlation of the detected nuclear magnetic resonance signal with the produced reference signal; and a step of simultaneously obtaining an image of the desired object region and a velocity of the object at any given position in the desired object region on the basis of said correlation, thereby reconstructing the image of the desired object region.

15. An image reconstruction method according to claim 14, wherein said velocity of the object is one in a direction perpendicular to a cross section of the desired object region.

* * * * *